(12) United States Patent
Beane

(10) Patent No.: US 6,669,029 B1
(45) Date of Patent: Dec. 30, 2003

(54) MOUNTING BRACKET FOR EFFICIENTLY STORING ELECTRONIC DEVICES

(75) Inventor: Timothy Paul Beane, Burnsville, MN (US)

(73) Assignee: Edge Solutions, Minneapolis, MN (US)

( * ) Notice: Subject to any disclaimer, the term of this patent is extended or adjusted under 35 U.S.C. 154(b) by 0 days.

(21) Appl. No.: 09/948,321

(22) Filed: Sep. 7, 2001

(51) Int. Cl.$^7$ .................................................. A47F 7/00
(52) U.S. Cl. ......................... 211/26; 211/193; 248/243; 108/108
(58) Field of Search ........................... 211/26, 193, 186; 361/683, 829, 826, 724, 759, 801; 312/265.1, 265.2, 265.3, 265.4, 265.6, 223.1, 223.2; 248/558, 208, 216.4, 218.4, 223.21, 227.3, 243, 250; 108/108, 107, 106

(56) References Cited

U.S. PATENT DOCUMENTS

| | | | | |
|---|---|---|---|---|
| 4,668,030 A | * | 5/1987 | Everett | 312/257 R |
| 4,817,907 A | * | 4/1989 | Cougan | 248/558 |
| 5,379,976 A | * | 1/1995 | DeGirolamo | 248/221.2 |
| 5,579,924 A | | 12/1996 | Sands et al. | |
| 5,788,198 A | * | 8/1998 | Sharpe | 248/210 |
| 5,806,417 A | * | 9/1998 | Whiten et al. | 108/106 |
| 5,806,687 A | | 9/1998 | Ballesteros et al. | |
| 5,971,507 A | | 10/1999 | Peroni | |
| 6,095,345 A | | 8/2000 | Gibbons | |
| 6,175,999 B1 | | 1/2001 | Sloan et al. | |
| 6,185,098 B1 | | 2/2001 | Benavides | |

* cited by examiner

Primary Examiner—Robert W. Gibson, Jr.
Assistant Examiner—Khoa Tran
(74) Attorney, Agent, or Firm—Haugen Law Firm PLLP

(57) ABSTRACT

A mounting system for operably and compactly storing one or more electrical devices includes an elongated shaft structure having a component mounting portion and a support mounting portion, the component portion having a plurality of apertures disposed therein, with the apertures being disposed in a predetermined array that is configured to universally receive mounting implements from respective electronic devices to thereby secure the electronic devices to the mounting bracket in a substantially horizontally stacked configuration.

9 Claims, 4 Drawing Sheets

MOUNTING BRACKET FOR EFFICIENTLY STORING ELECTRONIC DEVICES

FIELD OF THE INVENTION

The present invention relates to mounting systems generally, and more particularly to mounting brackets for securing and storing various electronic components in an efficient manner. This invention also relates to methods for efficiently storing various electronic components.

BACKGROUND OF THE INVENTION

Electrical component systems, in particular computer systems, in use today often times incorporate a plurality of distinct components operably connected to one another. In many systems, a plurality of such components are utilized in combination at a single location, such that operable connection therebetween may be more easily facilitated. In such circumstances, a means for organizing and storing the respective electrical components is highly desirable. Consequently, various storage devices, including rack systems, have been developed to organize and position multiple electrical components at a single location.

Rack storage structures utilized today typically incorporate a horizontal "shelving" type configuration, wherein respective electrical components are mounted horizontally and shelved in a vertically-stacked configuration. Such a rack system is described, for example, in U.S. Pat. No. 6,095,345 to Gibbons. Such rack systems typically utilize a plurality of vertically-disposed holes in a support frame, whereby individual electronic components may be mounted thereto, either directly or via separate shelf units. In such a manner, the vertically-oriented rack systems in use today accommodate a plurality of distinct electronic devices mounted in a vertically-stacked orientation.

Though the rack storage structures utilized today assist in organizing respective electronic components and reducing space usage by such components, a number of drawbacks still exist with present systems. For example, vertical rack structures tend to occupy more space than is necessary due to mounting requirements enabling system administrator access for maintenance or other related procedures. For many electronic components, manipulation of multiple outer surfaces of respective electrical components is required on a substantially routine basis. Present storage racks typically require users or system administrators to access portions of respective electrical components disposed in compact and hard-to-reach locations. Furthermore, vertically-stacked rack configurations fail to provide convenient connection means between respective electrical components stored therein.

It is therefore a principle object of the present invention to provide a storage structure allowing compact storage of various electrical devices while maintaining convenient operator access thereto.

It is a further object of the present invention to provide a storage system for operably storing and securing electrical devices therein, wherein such electrical devices are mounted in a substantially horizontally-stacked configuration.

It is another object of the present invention to provide a mounting bracket for use in a mounting system for securing and storing a plurality of electrical devices in a horizontally-stacked configuration.

It is a yet further object of the present invention to provide mounting brackets for use in a mounting system for operably storing and securing one or more electronic devices, wherein the mounting system is universally configured for adapting to various electronic device manufacture size and mounting sequence specifications.

It is another object of the present invention to provide a mounting system incorporating one or more mounting brackets for mounting various electronic devices in a substantially horizontally-stacked configuration, wherein the mounting bracket includes a plurality of apertures at predetermined locations along a particular length thereof, which apertures conform to one or more Electronics Industry Association (EIA) standards for mounting implement spacing.

SUMMARY OF THE INVENTION

By means of the present invention, an efficient mounting system is provided for operably storing and securing one or more distinct electronic devices thereto. This is achieved by mounting the electronic devices in a horizontally stacked configuration, wherein mounting brackets making up the mounting system of the present invention provide mounting apertures disposed substantially along a horizontal axis. By using such mounting brackets, it has been found that it is possible to substantially reduce the volume taken up by storing the respective electronic devices. Furthermore, such mounting brackets increase user or system administrator accessibility to respective electronic devices, and also facilitate ease of interconnection between respective electronic devices. Such improvements are achieved without either reduction or compromise in electronic device performance.

One embodiment of the mounting system includes a mounting bracket having an elongated shaft structure including a component mounting portion and a support mounting portion, wherein the component mounting portion includes a plurality of apertures disposed therein in a predetermined array that is configured to universally receive mounting implements from respective electronic devices to thereby secure the electronic devices to the mounting bracket. The elongated shaft structure is particularly configured to mount to upstanding structures in a substantially horizontal orientation, such that the electronic devices are secured to the component mounting portion in a substantially horizontally stacked configuration. The component mounting portion of the mounting bracket may extend perpendicularly outwardly from the support mounting portion, wherein the support mounting portion is configured to mount to substantially vertical surfaces. A bracing portion of the mounting bracket preferably extends perpendicularly from the component mounting portion to thereby provide structural support to the mounting bracket. In other configurations, the bracing portion is oriented to brace against a respective surface of the mounted electrical components. The predetermined array of apertures disposed in the mounting bracket preferably conforms to standardized space requirements, and in particular to Electronic Industry Association standards 360D and 360E for spacing requirements between respective apertures.

Another embodiment of the mounting system of the present invention includes two or more mounting brackets securable to an upstanding structure and disposed in a substantially horizontal orientation, wherein the mounting brackets include elongated platforms having a plurality of apertures disposed therein. The apertures disposed in the mounting brackets are preferably formed in a predetermined array which is configured to universally receive mounting implements from respective electronic devices to thereby secure the electronic devices to the mounting bracket such that the electronic devices are secured to the elongated platforms in a substantially horizontally stacked configuration. The mounting brackets may be preferably disposed in a parallel and spaced apart configuration, whereby the electrical devices mounted thereto are disposed in a vertically-oriented, horizontally stacked configuration. The mounting brackets are also preferably configured such that a plurality of distinct electrical devices are simultaneously receivable in respective apertures therein.

DETAILED DESCRIPTION OF THE PREFERRED EMBODIMENTS

The objects and advantages enumerated above together with other objects, features, and advances represented by the present invention will now be presented in terms of detailed embodiments described with reference to the attached drawing figures which are intended to be representative of various possible configurations of the invention. Other embodiments and aspects of the invention are recognized as being within the grasp of those having ordinary skill in the art.

Figure 1:
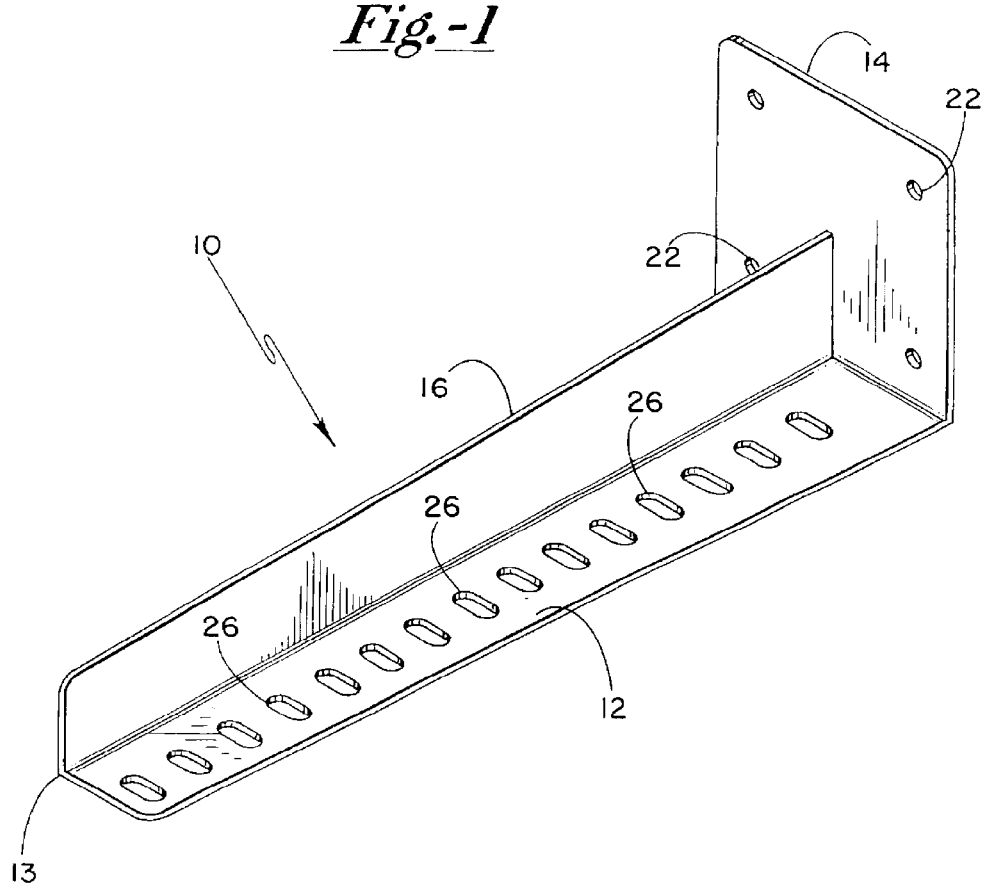
FIG. 1 is a perspective view of a mounting bracket in accordance with the present invention.

Referring now by characters of reference to the drawings, and first to FIG. 1, a mounting bracket 10 of the present invention is shown. Mounting bracket 10 is preferably a unitary structure which is shaped to provide desired attachment and support characteristics for securing various electronic devices thereto. As shown in FIG. 1, mounting bracket 10 preferably includes a component mounting portion 12, a support mounting portion 14, and a bracing portion 16. Though each portion of mounting bracket 10 is preferably integral with one another, particular portions may be separately attached thereto, by means of attachment mechanisms such as welding, fasteners, or any other attaching means.

Figure 2:
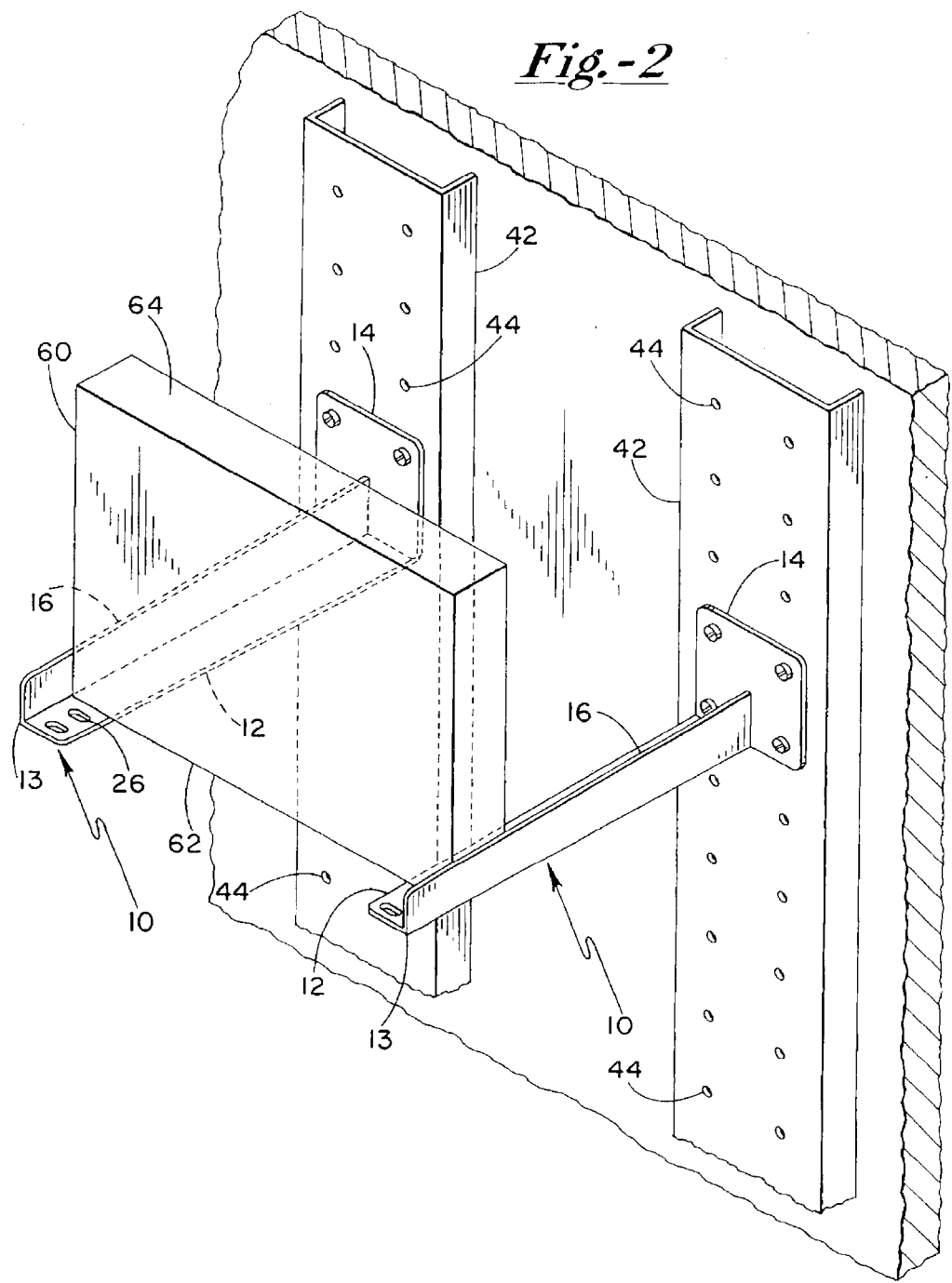
FIG. 2 is a perspective view of a plurality of mounting brackets secured to an upstanding frame structure in accordance with the present invention.

In the embodiment illustrated in FIG. 1, component mounting portion 12 preferably extends perpendicularly outwardly from support mounting portion 14 to form a substantially L-shaped structure. In other embodiments, component mounting portion 12 may extend at any acute or obtuse angle from support mounting portion 14 that is desired for particular applications. Most typically, however, component mounting portion 12 extends perpendicularly from support mounting portion 14, such that component mounting portion 12 extends along a substantially horizontal axis, while support mounting portion 14 is mounted to a respective support structure along a substantially vertical axis. As shown in FIG. 2, support mounting portion 14 may be operably coupled to a support frame 42 or the like which has sufficient integrity to support a plurality of electronic devices 60 mounted to component mounting portion 12. Support mounting portion 14 of mounting bracket 10 is preferably coupled to a respective support structure via mounting apertures 22 disposed therein. In a particular embodiment, mounting apertures 22 may be aligned with corresponding apertures 44 in a respective support structure 42 for insertion of mounting implements (not shown) therethrough. Such mounting implements act to secure mounting bracket 10 to the respective support structure.

In some embodiments of the invention, mounting bracket 10 may be operably secured to support structure 42 via a hinge mechanism for operably adjusting the mounting bracket angle with respect to support structure 42. In other embodiments, component mounting portion 12 may be coupled to support mounting portion 14 through a pivoting means for adjustably setting a desired angle between component mounting portion 12 and support mounting portion 14. Such a pivoting means may alternatively be provided on support mounting portion 14, which pivoting means is preferably adapted to mount to support structure 42.

Support structure 42 may be a variety of structures, including, but not limited to, a free-standing frame structure, a partial frame structure secured to a wall or other upright support, or an upright wall. In a particular embodiment, support structure 42 is preferably configured to provide a roll-out or slide-out drawer-type characteristic, such that electronic devices 60 secured to respective mounting brackets 10 may be horizontally moved with respect to support structure 42 without disengagement from respective mounting brackets 10. In some embodiments, mounting brackets 10 may be directly mounted to sliding structures such as drawers, which sliding structures are operably coupled to support structure 42.

Component mounting portion 12 preferably includes a plurality of component mounting apertures 26 disposed therein for mounting respective electrical devices to component mounting portion 12. Component mounting apertures 26 are preferably sized and configured to receive mounting implements such as screws, bolts, rivets, or the like therein to secure corresponding electrical devices to component mounting portion 12. In some embodiments, component mounting apertures 26 are elongated to accommodate variations in particular electrical device manufacturer spacing specifications between respective mounting implements in the electronic devices.

Component mounting apertures 26 are preferably disposed in component mounting portion 12 in a predetermined array or pattern which is configured to universally receive mounting implements from respective electronic devices 60. Therefore, any electronic device having a mounting chassis conforming to industry-imposed spacing standards may be mounted on mounting brackets 10 of the present invention. Component mounting apertures 26 are particularly defined to accommodate a plurality of distinct electronic devices 60. In particular, component mounting apertures 26 are defined in component mounting portion 12 in retma (U) mounting unit increments, as determined by relevant Electronic Industry Association (EIA) standards. In a particular embodiment, component mounting apertures 26 are defined in a predetermined array conforming to EIA standards 360D and 360E for spacing requirements between respective apertures.

Figure 4:
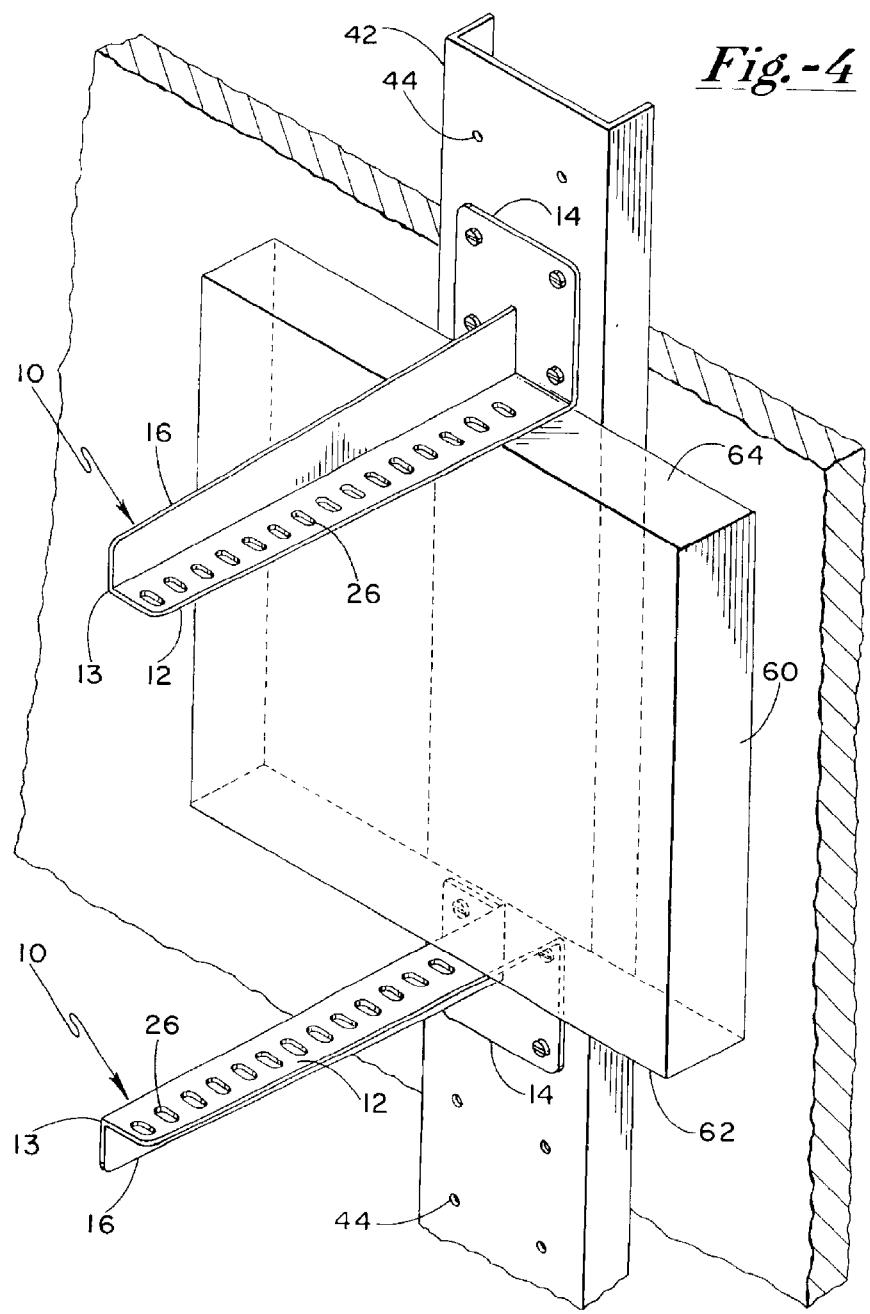
FIG. 4 is a perspective view of a mounting system in accordance with the present invention.

In preferred embodiments of the present invention, mounting bracket 10 includes a bracing portion 16 extending perpendicularly from component mounting portion 12. In some embodiments, bracing portion 16 preferably provides a support or bracing structure against which mounted electronic devices 60 may bear against for desired securement characteristics. In other embodiments, bracing portion 16 extends from component mounting portion 12 in a direction away from the mounted electronic devices to thereby provide structural support to mounting bracket 10. Such an embodiment is illustrated in FIG. 4, wherein two mounting brackets form upper and lower supports for one or more electronic devices 60 secured therebetween. Respective mounting brackets 10 are preferably particularly configured to provide weight-bearing means for adequately supporting attached electronic devices 60. For example, bracing portion 16 may be tapered to maximize structural support provided to mounting bracket 10.

Preferably, bracing portion 16 is formed integrally with component mounting portion 12 for desired strength and durability attributes. Bracing portion 16, however, may be separately secured to component portion 12 and/or support mounting portion 14 through a variety of securment means including welding, soldering, fasteners, or any other securing techniques. As shown in FIG. 2, mounting bracket 10 may comprise mirror-image configurations, whereby bracing portion 16 extends from an outer edge 13 of component mounting portion 12. In such a manner, bracing portion 16 provides an outer boundary between which respective electronic devices 60 may be mounted.

Figure 3:
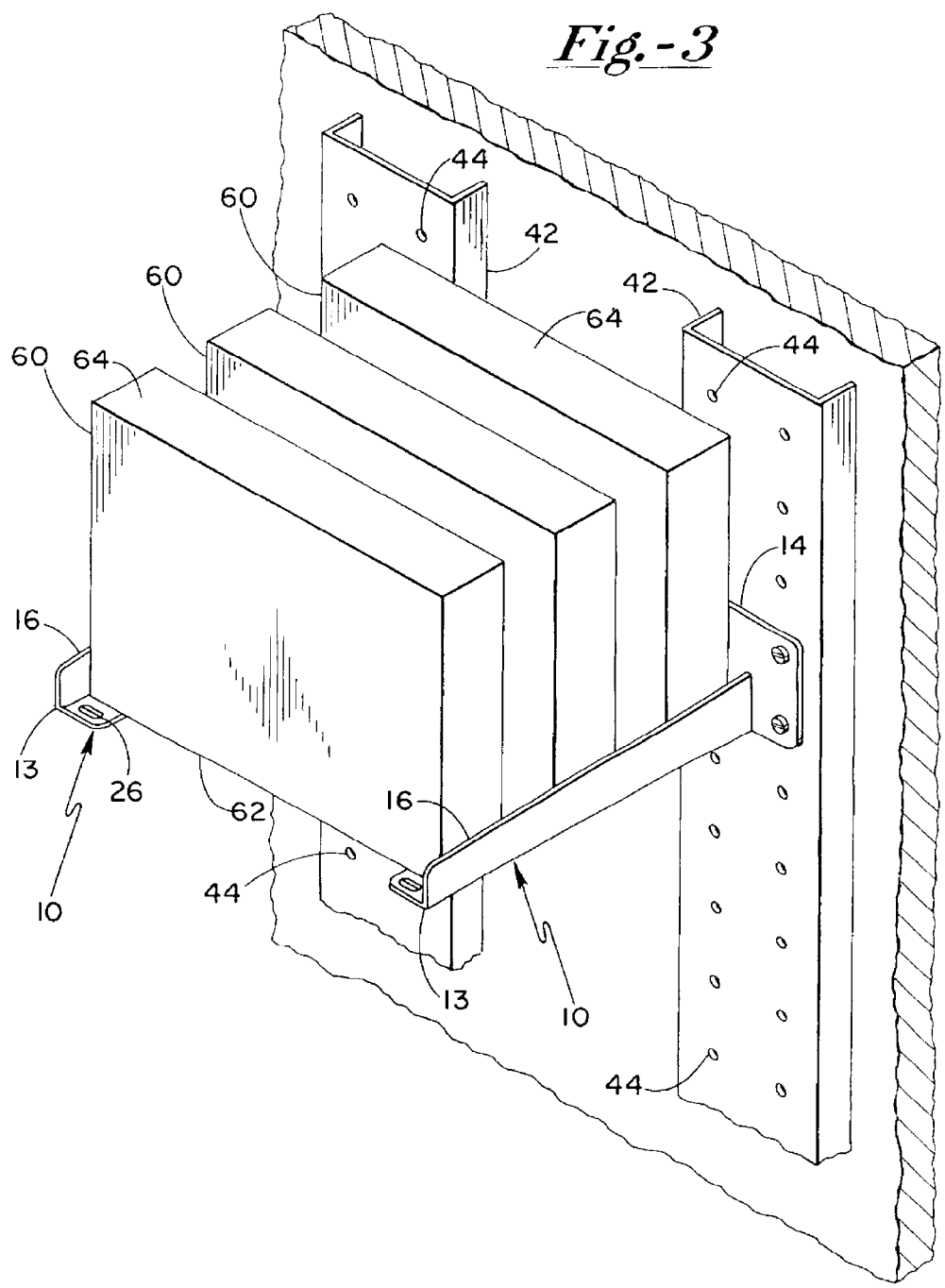
FIG. 3 is a perspective view of a plurality of electronic devices secured to a mounting system in accordance with the present invention.

As can be seen in FIGS. 3 and 4, a plurality of electronic devices 60 may be simultaneously mounted to a plurality of mounting brackets 10, which mounting brackets 10 substantially form a mounting system for storing and operably securing a plurality of distinct electronic devices thereon. The electronic devices 60 are preferably mounted in a substantially horizontally stacked configuration, whereby respective electronic devices are mounted in a substantially vertical orientation and horizontally stacked side-by-side on respective mounting brackets 10. In such a manner, a substantially higher concentration of electronic devices may be mounted on the mounting system of the present invention, as compared to existing systems.

In some embodiments of the present invention, four mounting brackets 10 may be utilized in combination to form a single mounting system, whereby respective electronic devices 60 are secured at four distinct locations on opposing ends thereof. With reference to FIG. 3, such an embodiment incorporating four mounting brackets 10 provides securement at opposing ends 62 and 64 of the respective electronic device 60.

Though a variety of materials are contemplated for use in manufacturing mounting brackets 10, it is preferred that 14 gauge cold-rolled steel is utilized. Other materials, however, may be utilized in mounting brackets 10, such as aluminum, galvanized steel, and stainless steel.

The mounting brackets of the present invention provide a mounting system for mounting a plurality of distinct electronic devices in a relatively compact environment. The horizontally stacked configuration of mounted electronic devices in the mounting system of the present invention substantially reduces volume occupied by the respective mounted electronic devices. Additionally, the horizontally stacked configuration facilitates system administrator access to desired portions of respective electronic devices. Furthermore, the orientation of the horizontally stacked electronic devices enhances and facilitates operable coupling between respective electronic devices while mounted in the mounting system of the present invention.

The invention has been described herein in considerable detail in order to comply with the patent statutes, and to provide those skilled in the art with the information needed to apply the novel principles and to construct and use embodiments of the invention as required. However, it is to be understood that the invention can be carried out by specifically different devices and that various modifications can be accomplished without departing from the scope of the invention itself.

What is claimed is:

1. A unitary one-piece mounting bracket for use in a mounting system for operably securing and storing one or more electronic devices, said mounting bracket comprising:

(a) an elongated shaft structure including a component mounting portion and a support mounting portion integrally formed therewith, said component mounting portion having an array of apertures disposed in said component mounting portion in a specific predetermined pattern for operably mounting such electronic devices to said component mounting portion so as to thereby secure said electronic devices to said mounting bracket, said elongated shaft structure being configured to perpendicularly mount to upstanding structures in a substantially horizontal orientation by operably inserting fasteners through said integrally formed support mounting portion and into the respective upstanding structure, said support mounting portion extending substantially perpendicular to and laterally beyond an outside edge of said component mounting portion to provide fastener receptacles at locations substantially laterally displaced from said component mounting portion so as to achieve a secure attachment to respective upstanding structures when fasteners are operably inserted through the fastener receptacles in said support mounting portion, such that said component mounting portion is adapted to operably mount such electronic devices thereto in a substantially horizontally stacked configuration.

2. A mounting bracket as in claim 1 including a bracing portion extending from said component mounting portion.

3. A mounting bracket as in claim 1 wherein said component mounting portion extends perpendicularly outwardly from said support mounting portion.

4. A mounting bracket as in claim 3 wherein a bracing portion extends perpendicularly from said component mounting portion to thereby brace against a respective surface of the electrical components mounted on said mounting bracket.

5. A mounting bracket as in claim 1 wherein said mounting bracket is adapted to concurrently secure a plurality of distinct said electrical devices thereto.

6. A mounting bracket as in claim 1 wherein said electronic devices include network boxes and server units.

7. A mounting system for operably and compactly storing one or more electronic devices, said mounting system comprising:

(a) two or more unitary one-piece mounting brackets separately securable to an upstanding structure through, an integrally formed support mounting portion so as to be disposed in a substantially horizontal orientation, said mounting brackets including elongated platforms having an array of apertures disposed in said elongated platforms in a specific pre-determined pattern for operably mounting such electronic devices to said elongated platforms to thereby secure said electronic devices to said mounting brackets, said support mounting portion extending substantially perpendicular to and laterally beyond an outside edge of said respective elongated platform to provide fastener receptacles at locations substantially laterally displaced from said respective elongated platform so as to achieve a secure attachment to the respective upstanding structure when fasteners are operably inserted through the fastener receptacles in said support mounting portion, such that said elongated platforms are adapted to operably mount such electronic devices thereto in a substantially horizontally stacked configuration.

8. A mounting system as in claim 7 wherein said mounting brackets are adapted to concurrently secure a plurality of distinct said electrical devices thereto.

9. A mounting system as in claim 7 wherein said electronic devices include network boxes and server units.

* * * * *